United States Patent
Morton

(10) Patent No.: US 6,392,436 B2
(45) Date of Patent: May 21, 2002

(54) PROGRAMMABLE CIRCUIT WITH PREVIEW FUNCTION

(75) Inventor: Christopher R. Morton, Rochester, NY (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/682,452

(22) Filed: Sep. 5, 2001

Related U.S. Application Data

(62) Division of application No. 09/562,099, filed on May 1, 2000.

(51) Int. Cl.[7] .............................. G05F 1/10; H01H 37/76
(52) U.S. Cl. ............................. 326/38; 326/49; 327/525
(58) Field of Search ............................. 326/30, 38, 49, 326/86; 327/525

(56) References Cited

U.S. PATENT DOCUMENTS

| | | | |
|---|---|---|---|
| 5,382,843 A | * 1/1995 | Gucyski | ................... 326/109 |
| 5,909,142 A | 6/1999 | Kawasaki et al. | ........... 327/525 |
| 6,037,798 A | * 3/2000 | Hedberg | ...................... 326/30 |
| 6,037,831 A | 3/2000 | Watrobski et al. | ........... 327/525 |
| 6,140,862 A | 10/2000 | Hagura | ........................ 327/525 |
| 6,160,420 A | 12/2000 | Gamal et al. | ................ 327/525 |
| 6,222,389 B1 | * 4/2001 | Williams | ....................... 326/86 |

* cited by examiner

Primary Examiner—Michael Tokar
Assistant Examiner—Daniel D. Chang
(74) Attorney, Agent, or Firm—Oliff & Berridge, PLC

(57) ABSTRACT

A programmable circuit and method of programming that provide an easily fabricated circuit that does not require specialize manufacturing or packaging techniques. The circuit provides for temporarily setting the circuit outputs which can then be used for testing. The circuit also provides for permanently setting the output by applying sufficient voltage and current to the transistor that permanent spiking of the metallized contact layer through the junction occurs.

14 Claims, 6 Drawing Sheets

PROGRAMMABLE CIRCUIT WITH PREVIEW FUNCTION

This is a Division of application Ser. No. 09/562,099 filed May 1, 2000. The entire disclosure of the prior application is hereby incorporated by reference herein in its entirety.

BACKGROUND OF THE INVENTION

1. Field of Invention

This invention is directed to a circuit that can be both non-permanently programmed and permanently programmed.

2. Description of Related Art

Fuses and fusible links are circuit elements that open by burning out or breaking when a relatively high current is applied. By selectively breaking or leaving intact specific fusible links, a circuit can be customized or programmed using these fusible elements. An antifuse is the opposite of a regular fuse. That is, an antifuse is normally an open circuit until a programming current is forced through it. Fuses and antifuses may be used to address many problems, including calibration requirements of analog circuits such as digital/analog converters, or current or voltage sources, logic synthesis circuits such as digital delays lines, or chip specific performance data to be used by the end system in which the chip will be used. These fusible and antifusible circuits are generally "programmed" after chip fabrication has been completed and during the wafer testing phase of chip production. The programming may be used to add additional resistors into a circuit to compensate for variations introduced during the manufacturing process or to compensate for oscillator frequency variations induced by manufacturing stress.

In many of these cases, it is desirable to simulate a programmed state before actually programming the device. For example, analog circuit calibration may require additional steps of simulation and refinement based on the previewed or simulated results obtained. These results are incorporated into further simulations to correctly calibrate the circuit during the testing phase. After testing, the circuit may then be permanently programmed.

Conventional programmed circuits employing, for example, fuses and anti-fuses, generally do not permit preview or simulation of the programmed circuit. Conventional programmed circuits require specialized packaging to ensure no overlay of the fusible or antifusible link occurs. That is, a conventional circuit can only be permanently programmed and not previewed. Once the conventional circuit is programmed, no further changes or refinements to the circuit are possible.

U.S. Pat. No. 6,037,871 to Watrobski et al. describes such a fusible link circuit including a preview feature that uses fusible links in combination with transistors to permanently set the value of an output. However, this fusible link circuit also requires special manufacturing and packaging techniques, as discussed above. For previewable devices such as those described in Watrobski, the device imposes specialized packaging, manufacturing, handling and cost limitations. Conventional fuse programming methods require that the selected device packaging technique be suitable for the programming structures. For example, the device packaging techniques need to facilitate air access to the fuse for burning and to avoid overlays that may act as heat sinks. A heat sink would increase the fuse blow temperature, which could possibly exceed the circuit temperature tolerance. Thus, manufacturers of products requiring these features must select packaging and fabrication techniques that are tailored to these fusible circuits and which are typically more expensive than non-programmable circuit fabrication and packaging techniques.

Erasable programmable read only memory (EPROM) and electrically erasable programmable read only memory, (EEPROM), devices may be programmed and reprogrammed. However, EPROM devices rely on specialized fabrication techniques and typically include a quartz window through which ultraviolet light of a specific wavelength may be introduced for several minutes to erase the chip in preparation for re-programming. In use, the quartz window is covered to prevent accidental erasure of the device. The EPROM devices require physical removal of the chip and or physical manipulation of the cover over the quartz window as well as considerable time to effect erasure in preparation for re-programming. Thus, EPROM devices require both specialized fabrication techniques and specialized handling during programming.

EEPROM circuits typically use floating gates surrounded by a much thinner insulating layer which can be erased by applying a voltage of the opposite polarity to the charging voltage to the non-floating gate. EPROM circuits overcome some of the EPROM device limitations with respect to the use of ultraviolet light to effect erasure. However, EEPROM devices also require special fabrication techniques in their manufacture. Furthermore, EEPROM devices require that special opposite polarity voltage levels be adopted for reading and writing to the EEPROM device.

SUMMARY OF THE INVENTION

Conventional programmable circuits are either write-once circuits that can be programmed but not re-programmed or read and write devices that can be programmed and re-programmed. The write-once circuits do not provide for simulating or previewing the state of a circuit before programming the circuit permanently. The read and write devices can be re-programmed after simulating or previewing the circuit but require special handling and manufacturing techniques.

Thus, a programmable circuit is needed that can be fabricated using conventional reliable and inexpensive fabrication techniques and that provides a preview function which uses normal circuit voltage levels for permanent programming and higher voltage levels for permanent programming.

This invention provides systems and methods for programming a circuit using a pull-down transistor as an antifuse in the circuit.

This invention separately provides a circuit having a preview function useable to simulate circuit characteristics using normal voltage.

This invention further provides a circuit that uses a higher voltage to permanently program the circuit.

The circuit can be fabricated using conventional, inexpensive and reliable fabrication techniques. The circuit includes a spike enable input structure which is used to determine when the chip is to be programmed. The circuit also includes a test and spike input structure which has at least two functions controlled by the setting of the spike enable input structure.

When the spike enable input structure is in the default or open state, a programmable transistor is in an open state. As a result the voltage at the output structure is at a first predetermined value. External tester electronics can be attached to the test and spike input structure to drive the output structure to the first predetermined voltage by leaving the test and spike input undriven or by driving the test and spike input structure to the first predetermined voltage. Conversely, the external electronics can drive the output structure to a second predetermined value by driving the test and spike input structure to the second predetermined value. Thus, the output of the circuit can be simulated or previewed before permanent programming of the circuit occurs.

A programmed state of the simulated programmable previewable circuit can be created by asserting an enable signal on the spike enable input. A test and spike input is then pulsed with a programming voltage that is higher than either the first or second predetermined voltages. The programming voltage is of sufficient amplitude, pulse width and frequency to cause the programmable transistor to enter the failure mode, known as snap back. During the snap back mode, the programmable transistor carries a large current density. The large current density in turn causes silicon to dissolve into the metallic layer connected to a source drain of the programmable transistor, so that a void is created below the interface which is then infilled by metal flow in a process called spiking. The metal tends to form sharp spikes which penetrate the junction and forms a short circuit which creates a permanent closed path. Thus, a permanent closed state is created by spiking the programmable transistor as a result of the programming operation. The circuit may still be changed and previewed during the non-permanent default, or simulation phase.

Various exemplary embodiments of the methods according to this invention comprises applying a signal having the second predetermined voltage to the test and spike input structure while a signal is applied to the spike enable input structure to hold the programmable transistor in an open state. The output signal generated in response to the applied input signal is compared to the desired output signal. A determination is made whether the generated output signal corresponds to the desired output signal. If the comparison indicates that the examined output signal corresponds to the desired output signal, a programming signal is then applied to the test and spike input while the spike enable input is driven to the closed state to permanently program the pull-down transistor to a spiked condition, thus, the second predetermined voltage becomes permanently applied to the output structure.

It should be noted that the programmable previewable circuit of this invention does not rely on fuses. Instead, the programmable previewable circuit uses spiking of the transistor to permanently set the circuit to a closed state. Therefore, the programmable previewable circuit can be used in circuits without the special packaging normally required to minimize heat sink problems. Since the circuit can use conventional, inexpensive and reliable manufacturing techniques, it will reduce or eliminate the manufacturing changes required to use conventional programmable circuits.

This is a major advantage in situations where the integrated circuit must be covered by some passivation or encapsulation since any material covering a fuse will act as a heat sink requiring higher currents and voltages in order to cause the fuse to blow. These higher currents and voltages could damage the surrounding circuits.

These and other features and advantages of this invention are described in or are apparent from the following detailed description of various exemplary embodiments of the systems and methods according to this invention.

BRIEF DESCRIPTION OF THE DRAWINGS

Various exemplary embodiments of this invention will be described in detail, with reference to the following figures, wherein.

DETAILED DESCRIPTION OF EXEMPLARY EMBODIMENTS

Figure 1:
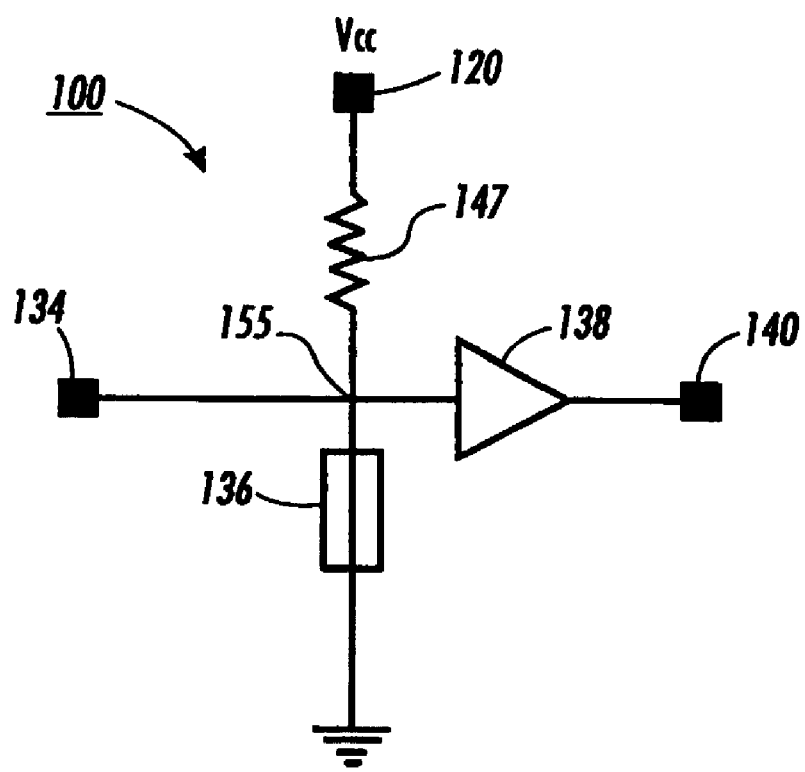
FIG. 1 shows a conventional fusible link circuit.

FIG. 1 shows one example of a conventional fusible link circuit 100. The fusible link circuit 100 comprises a program input structure 134, an output buffer element 138, an output structure 140, a fusible link 136 and a pull-up resistor 147. The program input structure 134, the fusible element 136, the pull-up resistor 147 and the output buffer element 138 are all connected to a common node 155. The pull-up resistor 147 is connectable to a predetermined voltage source 120. The fusible link 136 is normally closed to connect the node 155 to ground. The output buffer element 138 is connected to the output structure 140. In the fusible link circuit 100, when an input signal of sufficient amount of power is input to the program input structure 134, the fusible element 136 is blown or forced to an open condition. In response, the logic output at the output 140 is established at the voltage of the predetermined voltage source 120. If, however, the fusible element 136 is left intact, then the buffer logic output 140 is held at a ground voltage due to the node 155 being connected to ground, through the fusible element 136.

In this type of conventional fusible link circuit 100, the output signal present on the buffer logic output 140 is entirely dependent on the state of the fusible link 136 without regard to the input signal on the input 134. For instance, if a signal applied to the program input structure 134 is insufficient to force the fusible element 136 to an open condition, then the output on the buffer logic output 140 would have a value of approximately zero. If, however, the buffered logic output 140 is to be driven to a high level, dependent upon the supply voltage, then the fusible element 136 will need to be forced to an open condition by the input signal on the program input structure 134. Consequently, the conventional fusible link circuit 100 suffers from the fact that the output of the circuit is totally dependent upon the state of the fusible element 136. In such configurations, simulating a blown fusible element is not possible since the output level at the output 140 is totally dependent on the physical state of the fusible elements 136.

Consequently, if, after destroying the fusible element 136, it is found that the fusible element 136 should not have been forced to an open condition, it is impossible to repair the fusible element 136, particularly in an integrated circuit, to achieve the previous state. One technique for dealing with this problem is presented in U.S. Pat. No. 6,037,871 to Watrobski et al. The 871 patent employs fusible links in and transistors in combination to accommodate testing and permanently setting the device. However, Watrobski suffers from the problem of requiring special packaging requirements. For example, Watrobski's technique cannot be used when the circuit must be covered, since the covering material will act as a heat sink that effectively prevents the fusible link from being blown without hurting the circuit.

Figure 2:
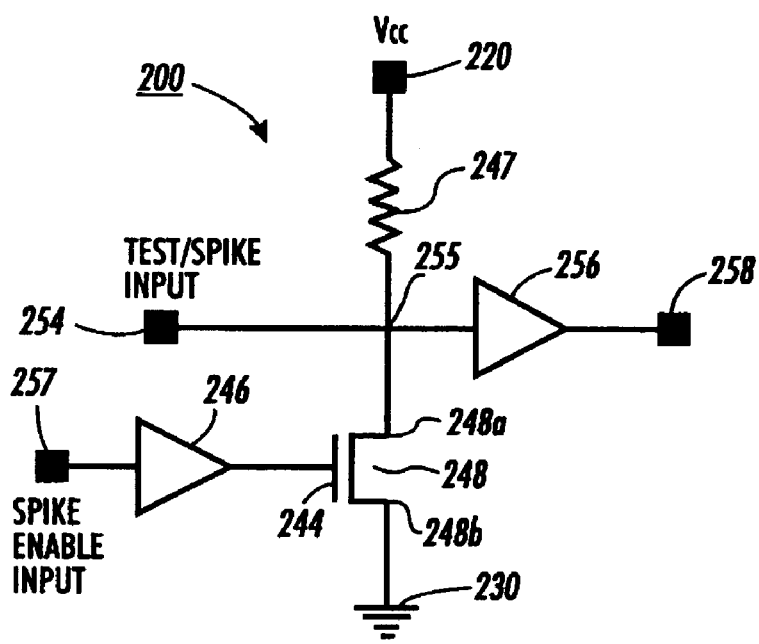
FIG. 2 shows an exemplary embodiment of the programmable previewable circuit according to this invention.

FIG. 2 illustrates one exemplary embodiment of the programmable previewable circuit 200 according to this invention. The programmable previewable circuit 200 includes a spike enable input structure 257, a test and spike input structure 254, an output structure 258, a pull-down transistor 248, an isolating input buffer 246 an isolating output buffer 256 and a resistor 247. The output structure 258, the test and spike input structure 254, the pull-up resistor 247 and a first junction 248a of the pull-down transistor 248 are connected at a node 255. The other end of the resistor 247 is connected to a voltage source 220 that applies a first predetermined voltage to the node 255 through the resistor 247. In contrast, the second junction 248b of the pull-down transistor 248 is connected to a "ground" voltage 230 that supplies a second predetermined value. When the transistor 248 is closed to connect the node 255 to the ground voltage 230, the node 255 is driven to the second predetermined voltage.

In the circuit 200, the spike enable input structure 257 is normally at a voltage level that places the pull-down transistor 248 into a default open, state. This both disconnects the node 255 from the ground and prevents the pull-down transistor 248 from being permanently set. External electronics can be applied to the test and spike input structure 254 to drive the output buffer 256 to a desired predetermined voltage value. In particular, the external test electronics can either not place a voltage on the test and spike input structure 254 or can place the first predetermined voltage on the test and spike input structure 254. As a result, the pull-up resistor 247 pulls the node 255 to the first predetermined voltage supplied by the voltage supply 220. In contrast, the external test electronics can place the second predetermined voltage corresponding to the ground voltage 230, on the test and spike input structure 254. As a result, the node 255 is pulled to the second predetermined voltage by the external test electronics. The value of the output buffer 256 can then be read at the output structure 258.

In order to permanently program the circuit 200, a large current is forced through the transistor 248 by applying a signal to the spike enable input structure 257 that closes the transistor 248. A higher voltage programming pulse train of sufficient amplitude, duration and frequency is applied to the test and spike input structure 254. The large potential across the transistor 248 between the voltage applied through the test and spike input structure 254 to the first junction 248a and the second predetermined function applied by the ground voltage 230 to the second junction 248b causes the transistor 248 to go into snap back. This creates a very large current density through the functions 248a and 248b. This large current density causes the contacts on the junctions 248a and 248b to spike down through the junctions 248 creating a short circuit to the ground voltage 230, permanently removing the resistor 247 and the voltage source 220 from the circuit 200.

Figure 6:
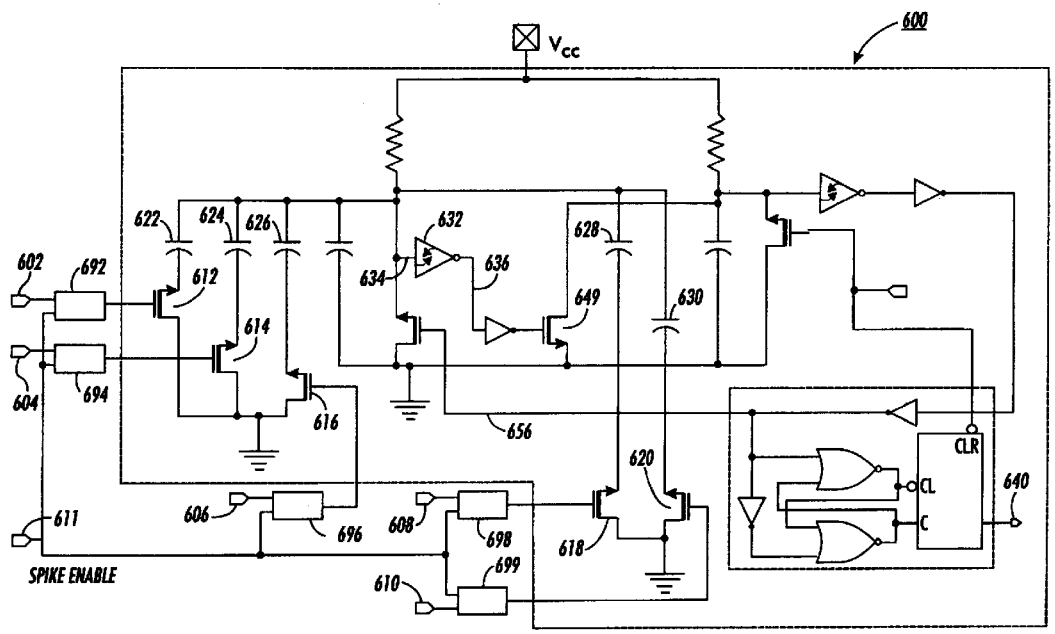
FIG. 6 shows a temperature controlled oscillator that that incorporates one exemplary embodiment of this invention.

The output structure 258 of the exemplary embodiment of the circuit 200 can be coupled to a temperature controlled oscillator circuit 600 as shown in FIG. 6, such that a grounded state or spiked state of the transistor 248 can be simulated by applying an input signal of the described levels to the test and spike input structure 254 while the spike enable input structure 257 holds the transistor 248 in an open state. Consequently, the programmable previewable circuit according to this invention is capable of non-destructively simulating logical states of one or more programmable previewable elements of an electronic circuit.

Such programmable previewable circuits, however, are not limited to the application of temperature controlled oscillator 600 but are also applicable to any of known or later developed circuit, including integrated circuits, that require programming, circuits that enable functions such as logic network synthesis in ASICs, encoding or inscription of serial numbers, passwords, or electronic "combination lock" data, and storage of performance data in a product measured prior to reaching an end user require programming. In such circuits, whether or not a given programmable previewable circuit element is to be forced to a spiked condition or left at its default state is typically determined independently of the element itself.

For example, in programmable logic devices, a synthesized logic network is realized by permanently setting or forcing to a known state the required programmable previewable circuit elements based on algorithms generated by a compiler. A serial number is a known digital quantity which is encoded into a device. A device's measured output power can be represented by a digital quantity encoded in a plurality of programmable previewable circuit elements. In these cases, the typical configuration of a fusible link circuit is described by a fuse element located between a ground node and a "blow" node as shown in the conventional circuit of FIG. 1. In these configurations, simulating a blown fuse is not possible since "normal" logic voltage applied to the input would destroy the fuse element.

The programmable previewable circuit according to this invention, however, allows measurement or changes in a circuit's behavior to be observed by applying the first or second predetermined voltages to the circuit so long as the first and second predetermined voltages remain within the normal voltage levels for each circuit. The measured values of the circuit's behavior over the combinations of the simulated states can then be compared to a predetermined reference value. The combination of programmed and default states for the various programmable previewable antifuses associated most closely with the desired reference output signal can be permanently written or programmed into a circuit by applying a close signal to particular ones of the spike enable input structures 257 to close the corresponding transistor 248 and by applying higher programming voltages sufficient to cause spiking of the metallic contacts through the junction and into the substrate, but low enough to avoid any damage to the other circuit elements.

Once it has been determined that the desired output state to be generated at the output structure 258 requires the transistor 248 to be spiked, the spike enable input structure 257 is enabled and a programming voltage pulse train of sufficient amplitude and with peaks of sufficient duration and frequency is applied to the test and spike input structure 254 to cause the transistor 258 to spike. This input signal should include an amplitude which is low enough so as not to damage other elements in the circuit while being high enough to cause the transistor 248 to spike. The spiking causes a short circuit to ground at the junctions 248a and 248b.

Figure 3:
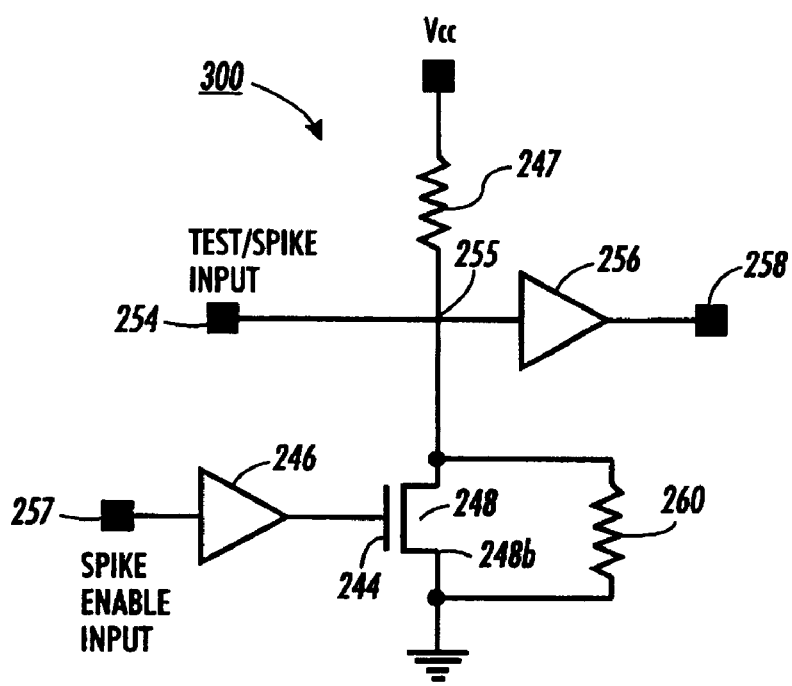
FIG. 3 shows an exemplary embodiment of the programmable previewable circuit of this invention after the programmable previewable circuit is permanently programmed.
Figure 5:
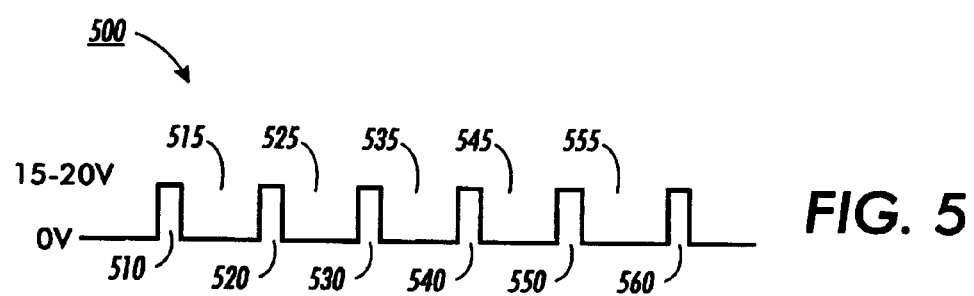
FIG. 5 shows an exemplary embodiment of a programming pulse signal according to this invention.

FIG. 3 shows the physical changes that take place in the programmable previewable circuit 200 as a result of enabling the spike enable input structure 257 while placing the programming signal input pulse train of FIG. 5, on the test and spike input structure 254. The resistive path 260 to the ground voltage 230 created by spiking the first junction 248a of the transistor 248 is shown in FIG. 3.

Figure 4:
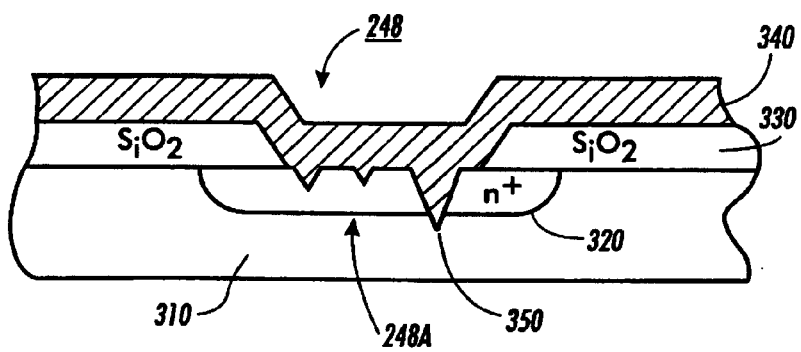
FIG. 4 shows an exemplary cross sectional view of the development of a spike in exemplary embodiment of this invention.

FIG. 4 illustrates a cross sectional view of one exemplary embodiment of the pull-down transistor 248. In particular, FIG. 4 shows just the first junction 248a of the transistor 248 after spiking. As shown in FIG. 4, the transistor 248 includes a substrate 310, a junction 248a, which, in this exemplary embodiment of the transistor 248 is a $n^+$ region 320, an insulation layer 330 of silicon dioxide ($SiO_2$) and a metallization layer 340. The metallization layer 340 connects the junction 248a to the node 255. In particular, the metallization layer 340 extends through a window formed on the insulation layer 330 and contacts the $n^+$ region 320. In various exemplary embodiments of the metallization layer 340, usable in the programmable previewable circuit according to this invention, the metallization layer 340 comprises aluminum doped with 1% silicon.

Before spiking, the $n^+$ region 320 separates the metallization layer 340 from the substrate 310. However, after spiking, a spike 350 of the material forming the metallization layer 340 extends through the $n^+$ region 320 and into the substrate 310. As a result, the metallization layer 340 is permanently resistively connected to the substrate 310.

FIG. 5 shows one exemplary embodiment of a programming pulse train 500 that can be applied to the test and spike input structure of 254 to initiate snap back in the transistor 248 and thus spike the transistor 248. As shown in FIG. 5, the pulse train 500 includes first-sixth pulses 510–560, separated by inter-pulse periods 515–555. In general, during the pulses 510–560 a voltage of approximately 15V–20V is applied to the transistor 248 from the test and spike input structure 254. In contrast, during the inter-pulse periods 515=14 555, a voltage of approximately OV is applied to transistor 248. However, depending on the design of the transistor 248, the voltage to be applied during the pulses can be higher or lower, so long as the applied voltage is sufficient to spike the transistor 248.

The exemplary pulse train 500 includes six pulses 510–560. However, it should be appreciated that the number, amplitude, duration and frequency of the pulses may be varied freely so long as the transistor 248 spikes without damaging other circuit elements of the chip.

The first pulse 510 of the exemplary embodiment is followed by an interpulse period 515. The second pulse 520 is in turn followed by an interpulse period 525. The first pulse 510 is 0.5 microseconds long while the first interpulse period 515 is 2 milliseconds long and the second pulse 520 is 0.4 microseconds long. The remaining pulses are 0.4 microseconds long while the other interpulse periods 525–555 are 2 milliseconds long. However, it should be appreciated that junctions composed of different compounds and different structures than those used in this exemplary embodiment may be used, and that junctions composed of different compounds may employ different voltage levels, pulse widths and interpulse widths. For example, CMOS junctions may be used in place of the NMOS junctions used in the exemplary embodiment of the transistor 248 described above.

In general, programming a programmable previewable circuit can be accomplished using any type of signal that will induce spiking into the particular type of transistor used in the programmable previewable circuit according to this invention. Any type of transistor which can be spiked can be used in the programmable previewable circuit according to this invention. Different types of transistor fabrication techniques may be used. Furthermore, metallization layers differing from the exemplary metallization layer 340 containing 1 percent silicon, or aluminum copper combinations, may also be used. It should be appreciated that various pulse widths, frequencies and durations will be appropriate for different metallization layers, different circuit feature sizes and or different transistor fabrication techniques, and should be selected to ensure spiking while avoiding damaging other circuit circuits in the chip.

FIG. 6 shows a tunable temperature controlled oscillator circuit 600 that incorporates an exemplary embodiment of the programmable previewable circuit according to this invention. The temperature controlled oscillator circuit 600 is connected to first, second, third, fourth and fifth programmable previewable circuits 692, 694, 696, 698, and 699.

An accessible test and spike input structure 602, 604, 606, 608, and 610, is coupled, respectively, to each of the programmable previewable circuits 692, 694, 696, 698, and 699. Each of the test and spike input structures 602, 604, 606, 608, and 610 is coupled to one of the input structures of the programmable previewable circuits 692–699. A common spike enable structure 611 is coupled to the spike enable input structures 257 of the programmable previewable circuits 692–699, for example, spike enable input structure 257 of FIG. 2.

The programmable previewable circuits 692–699 includes the output structures 258, which are coupled to the gates of the associated MOS transistors 612, 614, 616, 618, and 620, respectively. Each of the MOS transistors 612–620 is coupled to an associated capacitor 612–620. These five capacitors 612–620 are also coupled to an input 634 of a Schmitt trigger 632. An output signal on a trigger output 636 is determined, at least in part, by the operable presence or absence of each of the capacitors 622, 624, 626, 628, and 630 on the tuneable temperature controlled oscillator circuit 600. The operable states of the capacitor, 622–630 are determined by the simulated or actual states of the respectively associated programmable previewable circuits 692–699.

The outputs of the programmable previewable circuits 692–699 can be temporarily programmed by applying input signals to the corresponding programmable previewable circuit input structures 254 to simulate the desired output. The programmable previewable circuits 692–699 can be permanently programmed by applying an enable signal to the corresponding spike enable input structure 257.

The circuit 600 is designed to generate an output 640 signal having a predetermined frequency that is indicative of the sensed temperature. However, due to the variations of integrated circuit fabrication, the signal provided at the output 640 must be determined and tuned with respect to a predetermined reference signal. Consequently, the signal provided at the output 640 may be adjusted by applying five input signals simultaneously to the inputs of the programmable previewable circuits 692–699 and then varying these signals to generate a range of outputs that are then compared to the desired signal to be obtained at the output 640.

While this invention has been described in conjunction with a specific embodiment thereof, it is evident that many alternatives, modifications, and variations will be apparent to those skilled in the art. For instance, this invention is not limited to the embodiments shown, but is applicable to any programmable previewable circuit useful for programming or establishing the output of an electronic circuit. Accordingly, it is intended to embrace all such alternatives, modifications and variations that fall within the spirit and broad scope of the appended claims.

What is claimed is:

1. A programmable circuit, connected to a first voltage source providing a predetermined voltage comprising:
    a first input structure connected to a common node, wherein when a first signal is placed on the first input structure, the output state of the programmable circuit is temporarily set;
    a transistor connected to a second voltage source providing a second predetermined voltage and to the common node;
    a resistor connected between the first voltage source and the common node;
    a second input structure connected to the transistor;
    wherein, when a programming enable signal is applied to the second input structure, a programming signal applied to the first input structure permanently sets the output state of the programmable circuit; and
    wherein the transistor uses a gallium arsenide manufacturing technique.

2. A programmable circuit, connected to a first voltage source providing a predetermined voltage comprising:
    a first input structure connected to a common node, wherein when a first signal is placed on the first input structure, the output state of the programmable circuit is temporarily set;
    a transistor connected to a second voltage source providing a second predetermined voltage and to the common node;
    a resistor connected between the first voltage source and the common node;
    a second input structure connected to the transistor;
    wherein, when a programming enable signal is applied to the second input structure, a programming signal applied to the first input structure permanently sets the output state of the programmable circuit; and
    wherein the programming signal is sufficient to cause the metallization layers of the transistor to spike into a substrate of the transistor.

3. The programmable circuit of claim 2, wherein the metallization layer contains at least one of copper and a silicide.

4. The programmable circuit of claim 2, wherein the metallization layer contains at least one of tantalum silicide, titanium silicide and molybdenum silicide.

5. A method of non-permanently programming and reading a programmable previewable circuit comprising:
    a first input structure connected to a common node;
    a transistor connected to the common node;
    a resistor connected between a first voltage source and the common node;
    a second input structure connected to the transistor;
    wherein non-permanently setting the programmable previewable circuit comprises the steps of:
    applying a non-enabling signal to the second input structure;
    applying a desired signal to the first input structure;
    reading an output signal from the common node structure which is a function of the desired signal; and
    wherein the transistor uses a gallium arsenide manufacturing technique.

6. A method of non-permanently programming and reading a programmable previewable circuit comprising:
    a first input structure connected to a common node;
    a transistor connected to the common node;
    a resistor connected between a first voltage source and the common node;
    a second input structure connected to the transistor;
    wherein non-permanently setting the programmable previewable circuit comprises the steps of:
    applying a non-enabling signal to the second input structure;
    applying a desired signal to the first input structure;
    reading an output signal from the common node structure which is a function of the desired signal; and
    wherein applying the programming signal is sufficient to cause the metallization layers of the transistor to spike into a substrate of the transistor.

7. The method of permanently programming the programmable previewable circuit of claim 6, wherein the metallization layer contains least one of copper and a silicide.

8. The method of permanently programming the programmable previewable circuit of claim 6, wherein the metallization layer contains at least one of tantalum silicide, titanium silicide and molybdenum silicide.

9. In an electronic circuit, a method of permanently setting a selectable impedance element that is connected between a node and a first source, the method comprising:
    setting the selectable impedance element to a first state;
    applying a first input to the node of the electronic circuit;
    setting the selectable impedance element to a second state;
    applying a second input to the node while the selectable impedance element is in the second state, wherein the second input permanently alters the selectable impedance element between the first state and the second state.

10. The method of claim 9, wherein applying the second input while the selectable impedance element is in the second state places the selectable impedance element permanently in the second state.

11. The method of claim 10, wherein:
    setting the selectable impedance element to the first state comprises setting the selectable impedance element to a high impedance state; and
    setting the selectable impedance element to a second state comprises setting the selectable impedance element to a low impedance state.

12. The method of claim 10, wherein applying a second input to the node while the selectable impedance element is in the second state comprises directing a large current through the selectable impedance element.

13. The method of claim 12, wherein:
    setting the selectable impedance element to the first state comprises setting the selectable impedance element to a high impedance state;
    setting the selectable impedance element to a second state comprises setting the selectable impedance element to a low impedance state; and
    directing a large current through the selectable impedance element comprises applying a high voltage to the node.

14. The method of claim 12, wherein applying the first input to the node of the electronic circuit comprises, while holding the selectable impedance element in the first state, applying to the node an input that simulates setting the selectable impedance element to the second state.

* * * * *